United States Patent [19]

Harada

[11] Patent Number: 4,783,691

[45] Date of Patent: Nov. 8, 1988

[54] COLOR SOLID-STATE IMAGE SENSOR

[75] Inventor: Nozomu Harada, Yokohama, Japan

[73] Assignee: Kabushiki Kaisha Toshiba, Kawasaki, Japan

[21] Appl. No.: 864,156

[22] Filed: May 16, 1986

[30] Foreign Application Priority Data

Jun. 21, 1985 [JP] Japan ................................ 60-135315

[51] Int. Cl.$^4$ ...................... H01L 27/14; H01L 29/78
[52] U.S. Cl. ........................................ 357/30; 357/24; 357/31; 357/55
[58] Field of Search ................ 357/30 H, 30 K, 30 L, 357/30 D, 30 G, 24 R, 31, 32, 4, 2, 55

[56] References Cited

U.S. PATENT DOCUMENTS 4,412,236  10/1983  Sasano et al. ........................ 357/30
4,608,749  9/1986  Harada et al. ........................ 357/31

FOREIGN PATENT DOCUMENTS 0024576  2/1982  Japan .................................... 357/31

OTHER PUBLICATIONS

IEEE Transactions on Electronics, vol. ED-30, No. 10, Oct. 1983, pp. 1386-1391; A CCD Imager Overlaid with a Thin-Film Photodetector of a Heterojunction ZnSe-Zn$_{1-x}$Cd$_x$Te; T. Chikamura, et al.

Primary Examiner—William L. Sikes
Assistant Examiner—Georgia Y. Epps
Attorney, Agent, or Firm—Oblon, Fisher, Spivak, McClelland & Maier

[57] ABSTRACT

A stacked type color solid-state image sensor in which a photoconductive film is formed evenly on a substrate having a matrix array of picture element cells and wiring pattern including a bonding pad pattern. The photoconductive film functions as an optoelectro-transducing section for the picture element cells. A color filter layer is formed on the photoconductive film such that it is positioned above the cell matrix area. A contact hole for a bonding pad pattern is formed in the photoconductive layer after the color filter layer has been formed. Since the photoconductive film is formed to cover the whole surface area of the substrate, the photoconductive film has an even surface when the color filter layer is formed over the photoconductive film. Thus, the color filter layer has a uniform, homogeneous surface. The degeneration of a color image signal due to an uneven surface of the color filter layer can be prevented by such an ingenious manufacturing design.

5 Claims, 3 Drawing Sheets

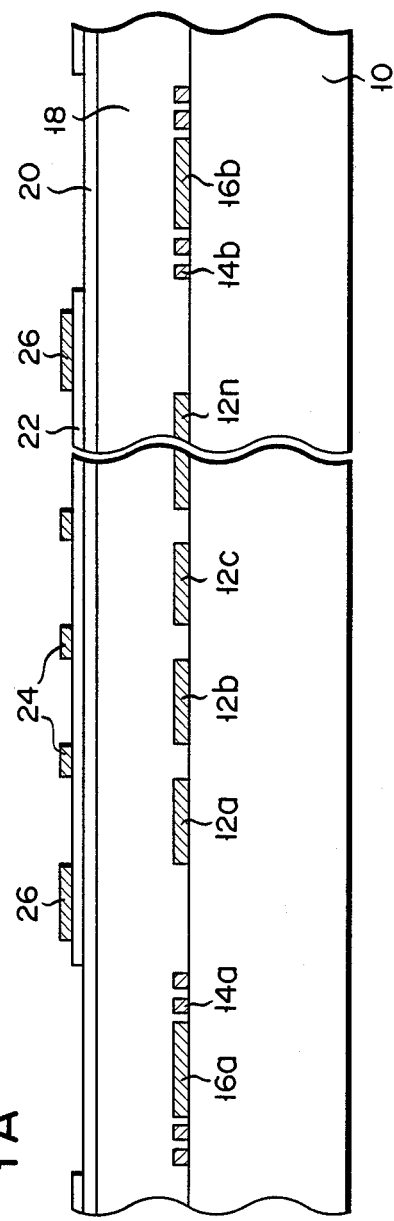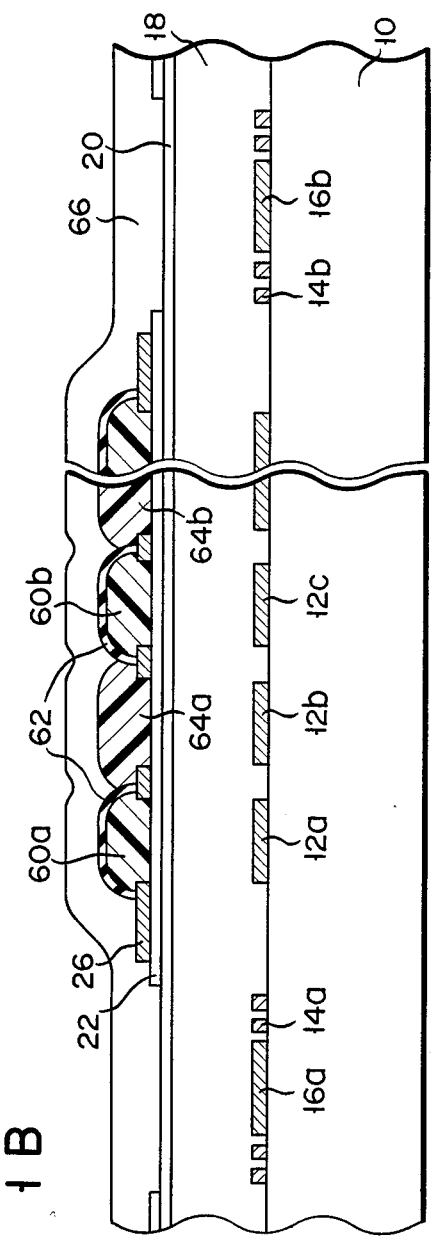

COLOR SOLID-STATE IMAGE SENSOR

BACKGROUND OF THE INVENTION

This invention relates to a color solid-state image sensor and, in particular, a double-layer type solidstate image sensor having a photoconductive film formed as an optoelectro-transducing area over a substrate.

A structure having a photoconductive film formed as an optoelectro-transducing area on a chip substrate is known in a color solid-state image sensor. The chip substrate is of a single-crystalline silicon type having a signal charge storing section and signal charge readout section. The stacking of the photoconductive film over the substrate permits a greater aperture ratio of the cell area, enhanced sensitivity and improved performance, such as the suppression of blooming.

A wiring pattern for transferring a signal, such as a clock signal, necessary for the operation of the solid state sensor is also formed on the surface of the substrate. The wiring pattern is formed on that surface portion of the substrate situated around the photoconductive film and has bonding pads to electrically connect the wiring pattern to an external circuit. It is necessary that the photoconductive layer be formed on only an initially allotted cell area of the substrate so as to prevent an overlap with the wiring pattern area. This is because the presence of any overlap between the photoconductive film and the wiring pattern area on the substrate prevents a bond from being made between the wiring pattern and an external wiring.

In order to provide a color solid-state image sensor it is further necessary to form a color filter layer on the surface of the resultant layer structure. The color filter layer is formed by diffusing a dye into organic matter, such as gelatin and milk casein. The color filter layer is spin-coated by a spinner on the top surface of the aforementioned layer structure. Since, however, that portion of the photoconductive film overlapping with the wiring pattern area on the substrate is removed prior to the spin coating of the color filter layer, the aforementioned layer structure to be coated with the color filter layer has an uneven top surface, with the result that a step corresponding to the thickness of the photoconductive film is formed between the light sensitive area and the wiring pattern. Therefore, the color filter layer is difficult to uniformly form due to the resultant uneven surface of the aforementioned layer structure. The surface nonuniformity of the color filter layer appears, for example, as a coating mark. In general, such an uneven coating tends to occur frequently at an edge portion of the photoconductive film having a planar surface corresponding to the light sensitive cell area on the substrate. That coating mark provides a cause for a smear (one kind of color noise) on a color reproduction image, thus degenerating a reproduction image quality greatly. As a result, a serious problem has been involved in a wider application of this invention to a "double-layer" type color solid-state image sensor.

SUMMARY OF THE INVENTION

It is accordingly an object of this invention to provide a new and improved color solid-state image sensor having an uniform color filter layer overlying the photoconductive film overlying each cell so as to improve a reproduction image quality.

In the manufacture of a stacked type color solid-state image sensor a photoconductive film is uniformly deposited over a substrate having a first surface area where a matrix array of picture element cells is formed and a second surface area where a wiring pattern, including a bonding pad pattern, is formed. The photoconductive film covers the array of picture element cells and serves as an optoelectro-transducing area for the picture element cells. A color filter layer for the picture element cells is formed over a resultant layer structure such that it is located over the first surface area. Subsequent to the formation of the color filter layer an opening is formed as a contact hole in the photoconductive film to expose the bonding pad pattern situated in the second surface area. Since the surface of the photoconductive film is flat and free from any uneven surface such as a step, the color filter layer can be uniformly formed over the photoconductive film without any coating mark. It is therefore possible to obtain a better color reproduction image. In this way, the aforementioned object can be attained.

The other object, as well as features and advantages, will be apparent with reference to the accompanying drawings.

BRIEF DESCRIPTION OF THE DRAWINGS

This invention is best understood with reference to the accompanying drawings.

FIGS. 1A to 1C are cross-sectional views showing the major steps of manufacturing a stacked type color solid-state image sensor.

DETAILED DESCRIPTION OF THE PREFERRED EMBODIMENTS

Figure 1C:
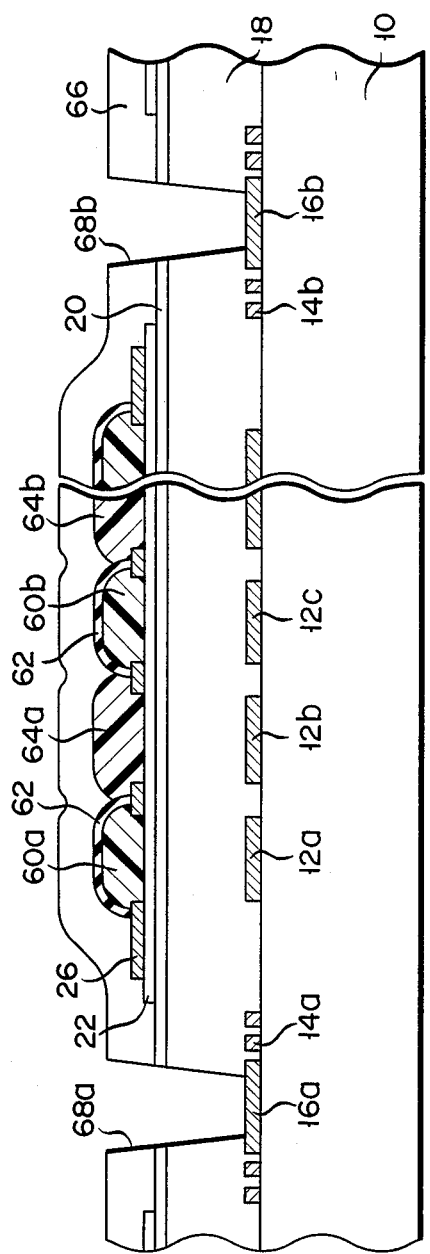

The major steps for manufacturing an interline transfer type color solid-state image sensor according to one embodiment of this invention will be explained below with reference to FIGS. 1A to 1C. FIG. 1A schematically illustrates a semifinished image sensor structure having components necessary to form a CCD cell matrix on chip substrate 10 of a single-crystalline silicon, as well as a wiring pattern, etc., on the resultant structure.

In FIG. 1A an array of metal layers 12a, 12b, ... 12n is formed on the top surface of, for example, P type chip substrate 10. Metal layers 12 serve as cell electrodes, each of which constitutes a picture element cell. In this connection it is to be noted that metal layers 12 are formed on substrate 10 within a sensor region (i.e. a surface area corresponding to one image sensor). A wiring pattern (14a, 14b ... ) for transferring a signal, such as a clock signal, necessary for the operation of a solid-state image sensor is formed on the surface of substrate 10. Wiring pattern 14 is formed within a special surface region (wiring region) which is located around the sensor region. Bonding pads 16a, 16b, ... are formed within the wiring area of substrate 10 to make an electrical connection with an external circuit, not shown. Photoconductive film 18 is formed on the surface of substrate 10 and made of an amorphous silicon in this embodiment. Photoconductive film 18 functions as an optoelectric-transducing section for the picture element cell array on the surface of substrate 10. As appreciated from the above, the color solid-state image sensor is of a stacked type.

Barrier layer 20 and transparent conductive layer 22 are formed by a known method on photoconductive layer 18 in that order. Barrier layer 20 is made of an amorphous silicon carbide and formed to prevent an entry, into layer 18 from outside, of charges identical in polarity to signal charges such as electrons which are produced by a light illumination in the image sensor. Transparent conductive layer 22 is made of an indium-tin-oxide (hereinafter referred to as ITO). Transparent electrode layer 22 is so formed as to cover only the underlying sensor region on substrate 10. The transparent electrode layer portion over the wiring region (where wiring line pattern 14 and bonding pads 16 are formed) is removed, so that no transparent electrode layer is formed above the wiring region on substrate 10. Thus, the edge portion of transparent electrode layer 22 does not overlap the wiring pattern (14a, 14b, ...). Two kinds of electrode layers 24 and 26 are formed on conductive layer 22. Electrode layer 24 bridges or spans a spacing between the cell electrodes and serves as a light shielding layer. Electrode layer 26 is located such that it bridges or spans a spacing between the wiring region and cell electrode 12 which is situated at an outermost periphery of the sensor region on the substrate and serves also as a light shielding layer.

Figure 2:
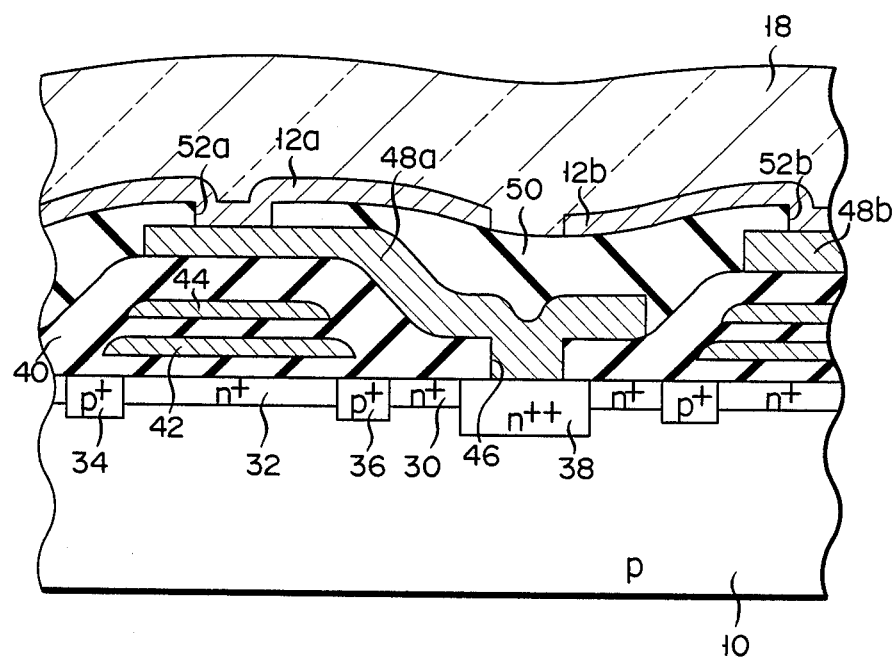
FIG. 2 is a diagrammatic view showing a major portion of an image sensor in FIG. 1, i.e., a detailed illustration showing one picture element cell area and adjacent picture element cell areas.

FIG. 2 is a cross-sectional view showing a major portion of the structure of FIG. 1A, i.e., one picture cell element and adjacent picture cell elements. In the surface portion of P type substrate 10 are formed N+ type diffusion layers 30 and 32 which function as a signal charge storing section and signal charge readout section, respectively. Known channel stopper layers 34 and 36 of a P+ type are formed one at each end of signal charge readout region 32. Signal storing region 30 contacts with channel stopper 36 at one end and contacts with n type diffusion layer 38 of a high impurity concentration (i.e. n++ type diffusion layer) at the other end.

Insulative layer 40 is formed on the surface of the resultant structure and made of a silicon oxide film. Two electrodes 42 and 44 which serve as carrier-transfer electrodes are formed in insulative layer 40 such that they are located above n+ type signal charge readout region 32. Carrier-transfer electrodes 42 and 44 are electrically insulated from each other by the gate insulating layer and opening 46 is formed in insulative layer 40 over n++ type region 38. Metal electrode layer 48a is formed on insulative layer 40 such that it is in contact with n++ type region 38 through opening (contact hole) 46. Another electrode layer 48b is formed in the same way as electrode layer 48a. The electrode layers 48a and 48b are made of, for example, aluminum. Second insulative layer 50 is deposited on electrode layers 48a and 48b to cover the latter. Openings (contact holes) 52a and 52b are formed in second insulative layer 50 such that metal layers 48a and 48b are electrically connected to n++ type regions 38. Cell electrode layer 12a and 12b as shown in FIG. 1A are formed on second insulative layer 50 such that they cover openings 52a and 52b. Thus n+ type signal charge storing region 30 is electrically connected to corresponding cell electrode 12a through n++ type region 38 and electrode layer 48a.

Transparent amorphous silicon layer 18 as shown in FIG. 1A is formed on the surface of the resultant structure to bury cell electrodes 12a, 12b, ... A layer structure on layer 18 is omitted, since it is shown in FIG. 1A.

It should be noted that n+ type layers 30 and 38 and metal electrodes 12 and 48 are independently formed for each picture cell element, a plurality of such n+ type layers and plurality of such metal electrodes 12 and 48 constituting a planar cell matrix array. Each of metal electrodes 12a, 12b, ... defines a picture element cell area of the image pickup image sensor. A potential variation occurs due to the photosensing of photoconductive film 18. This potential variation is transferred through the metal electrode layer (48a, 48b, ...) and n++ type diffusion layer (38, 38, ...) to n type signal charge storing section 30 where it is integrated (stored) as signal charges corresponding to incident image light. The resultant stored carriers are read out, at a proper time, through n type signal charge transfer layer 32 which serves as a CCD channel.

After the basic layer structure of the stacking type image sensor in FIG. 1A has been formed, a color filter layer section is formed as set forth below. In the cross-sectional area of the image sensor as shown in FIG. 1B, first color filter layers 60a, 60b, ... are formed for every other image cell area. Thus a space corresponding to one image area is left between the adjacent two color filter layers (for example, 60a, 60b). Color filter layer 60 is covered with insulating film layer 62. Second color filter layer (64a, 64b, ...) is formed on the conductive layer 22 in a gap between color filter layers 60. Second color filter layer 64 is prevented from directly contacting with first color filter 60. After the formation of color filter layers 60 and 64, protective layer 66 is formed over the whole surface of the resultant structure, noting that protective layer 66 covers not only the sensor area but also the wiring region.

As shown in FIG. 1C, contact hole 68 is formed, at a proper place, down across the underlying layers 66, 20 and 18 to expose bonding pad 16. Contact holes 68a and 68b are actually formed, in a better condition, using an ordinary etching technique. In this connection it is to be noted that the edge of transparent electrode layer 22 is receded from contact hole 68 for bonding pad 16 to permit an increased insulating distance left between transparent electrode layer 22 and bonding pad 16.

In the stacked type color solid-state image sensor formed according to the above-mentioned manufacturing method, photoconductive film 18 (and protective layer 66) is formed over the substrate to cover not only the sensor area but also the wiring area, noting that contact hole 68 for bonding pad 16 situated within the wiring region (pattern) is formed later down across layers 66 and 18. Even if the color filter layer is coated by a conventional spinner on photoconductive layer 18, it is possible to prevent an uneven coating mark, such as a coating streak, from being formed on the color filter layer. This is because, when color filter layers 60 and 64 are coated on photoconductive film 18, the photoconductive film 18 serves as an underlying smooth surface covering the whole surface of substrate 10. In other words, the upper surface of underlying photoconductive film 18, if being made smooth, permits color filter layers 60 and 64 to be uniformly formed thereon and thus there occurs no defective layer, such as an uneven coating mark. As a result, it is possible to eliminate a bad effect on a color reproduction image picked up by the stacked type image sensor due to an uneven surface of the color filter layers. Thus the quality of a reproduction image can be improved without the need of using any specific additional circuit, such as a noise reduction circuit.

In the image sensor according to the embodiment of this invention the light shielding layer (24, 26) which is electrically conductive is formed, between the color filter layers, on transparent electrode layer 22. A voltage of a proper polarity is applied between light shielding layers 24 and 26 to prevent charges of the same polarity as that of signal charges produced into photoconductive film 18 from flowing from the light sensing ara on the picture element cell into the wiring area. It is therefore possible to improve an electrical isolation (insulating characteristic) between the light sensing area of the picture element cell and the wiring area where the bonding pad is formed. It is also possible to prevent charges produced at an area other than the cell area of photoconductive film 18 from leaking into the light sensing area of the picture element cell. According to this embodiment, since transparent electrode layer 22 is not formed above the wiring area on substrate 10, it is possible to improve an electrical separation between peripheral light shielding layer 26 and bonding pad 16.

Although this invention has been shown and described with reference to particular embodiments, various changes and modifications which are obvious to a person skilled in the art to which this invention pertains are deemed to lie within the scop of this invention.

What is claimed is:

1. A color solid-state image-pickup device comprising:
   a semiconductor substrate having first and second surface areas on one side of said substrate;
   a matrix array of picture elements cells formed in the first surface area of said substrate;
   a wiring pattern formed in the second surface area of said substrate and including a bonding pad pattern;
   a photoconductive layer formed over said substrate to cover said picture element cells, said photoconductive layer functioning as an optoelectro-converting area;
   a transparent electrode layer formed on said photoconductive layer such that it is positioned above said picture element cells;
   a color filter layer for said picture element cells formed on said transprent electrode layer; and
   a protective layer formed on said photoconductive layer to cover said color filter layer;
   wherein an opening is formed, as a contact hole, in said protective layer and said photoconductive layer to expose the bonding pad pattern which is located on said substrate.

2. The device according to claim 1, further comprising a conductive light shielding layer formed on said transparent electrode layer to prevent light from being incident to a boundary space between picture element cells.

3. The device according to claim 2, in which said transparent electrode layer has an edge for preventing an overlap with said wiring pattern on the substrate.

4. The device according to claim 2, in which said opening is formed, as a contact hole, in said protective layer and said photoconductive layer to such an extent as to expose a major surface of said bonding pad pattern, but not to such an extent as to expose said transparent electrode layer.

5. The device according to claim 2, in which a barrier layer made of a semiconductor material is formed between said photoconductive film and said transparent electrode layer and said opening reaches said bonding pad pattern through said protective layer, barrier layer and said photoconductive film.

* * * * *